(12) United States Patent
Hackler, Sr. et al.

(10) Patent No.: US 7,652,330 B1
(45) Date of Patent: Jan. 26, 2010

(54) INDEPENDENTLY-DOUBLE-GATED COMBINATIONAL LOGIC

(75) Inventors: Douglas R. Hackler, Sr., Boise, ID (US); Stephen A. Parke, Nampa, ID (US)

(73) Assignee: American Semiconductor, Inc., Boise, ID (US)

( * ) Notice: Subject to any disclaimer, the term of this patent is extended or adjusted under 35 U.S.C. 154(b) by 244 days.

(21) Appl. No.: 11/306,736

(22) Filed: Jan. 9, 2006

Related U.S. Application Data

(63) Continuation-in-part of application No. 10/613,169, filed on Jul. 3, 2003, now Pat. No. 7,015,547.

(51) Int. Cl.
*H01L 27/01* (2006.01)
*H01L 27/12* (2006.01)
(52) U.S. Cl. ............... 257/347; 257/349; 257/E27.112
(58) Field of Classification Search ................ 257/347, 257/349, E27.112
See application file for complete search history.

(56) References Cited

U.S. PATENT DOCUMENTS

| | | | | |
|---|---|---|---|---|
| 5,349,228 A | | 9/1994 | Neudeck et al. ............ 257/365 |
| 5,773,331 A | | 6/1998 | Solomon et al. ............ 438/164 |
| 6,248,626 B1 | * | 6/2001 | Kumar et al. ............... 438/257 |
| 6,365,465 B1 | | 4/2002 | Chan et al. ................. 438/283 |
| 6,483,156 B1 | | 11/2002 | Adkisson et al. ............ 257/401 |
| 6,506,638 B1 | | 1/2003 | Yu ............................. 438/156 |
| 6,550,040 B1 | * | 4/2003 | Keller et al. ................... 716/4 |
| 6,759,710 B2 | | 7/2004 | Chan et al. ................. 257/250 |
| 6,838,322 B2 | | 1/2005 | Pham et al. ................. 438/151 |
| 6,946,696 B2 | | 9/2005 | Chan et al. ................. 257/250 |
| 2002/0123174 A1 | * | 9/2002 | Casady et al. .............. 438/135 |
| 2005/0001218 A1 | | 1/2005 | Hackler et al. ................ 257/78 |
| 2005/0001319 A1 | | 1/2005 | Hackler et al. ............. 257/758 |
| 2005/0263797 A1 | | 12/2005 | Chan et al. ................. 257/250 |
| 2007/0013413 A1 | * | 1/2007 | Chiang et al. .............. 326/121 |

OTHER PUBLICATIONS

Lee, et al., "Super Self-Aligned Double-Gate (SSDG) MOSFETs Utilizing Oxidation Rate Difference and Selective Epitaxy,".

(Continued)

*Primary Examiner*—Phat X Cao
(74) *Attorney, Agent, or Firm*—Your Intellectual Property Matters, LLC; Robert A. Frohwerk

(57) ABSTRACT

A family of logic circuits is constructed from double-gated four terminal transistors having independent gate control. First and second inputs to each logic element are independently coupled to the top and bottom gates of a transistor. The output voltage developed at either the source or drain represents an output logic state value according to the designed logic element. In a dynamic configuration the drain is precharged to an appropriate voltage. Complementary static CMOS configurations are also shown. Bottom Gates not driven by logic inputs or control signals may be biased to control the speed and power of the described logic circuits. Specific designs are given for AND, NAND, XOR, XNOR, OR and NOR combinational logic elements.

13 Claims, 21 Drawing Sheets

OTHER PUBLICATIONS

Microsystems Technology Laboratories, Massachusetts Institute Of Technology, Cambridge, MA, USA, pp. 3.5.1-3.5.4; reprinted as IEEE 1999 IEDM pp. 71-74.

Chiang, et al., "Novel High-Density Low-Power Logic Circuit Techniques Using DG Devices," IEEE Trans. on Electon Devices, vol. 52, No. 10, Oct. 2005, pp. 2339-2342.

Ioannou, et al., "A Novel sub 50nm DG-SOI Self-restoring Domino Logic," Presented at.
J2-12th International Symposium on Silicon-on-Insulator Technology and Devices, May 17, 2005; Retrieved on Dec. 28, 2005 from the Internet: <URL.
http://ecsmeet.peerx-press.org/ms_files/ecsmeet/2004/12/07/00005960/00/5960_0_art_file_0_1102446151_cnvpdf.pdf>.

* cited by examiner

Independently-Double-Gated IDG

Single-Gated SG

Double-Gated DG (A) Truth Table, NAND

| A | B | OUT=X |
|---|---|---|
| 0 | 0 | 1 |
| 0 | 1 | 1 |
| 1 | 0 | 1 |
| 1 | 1 | 0 |

(B) Symbolic Notation, NAND (C) Dynamic NAND Circuit (D) Static Complementary NAND Circuit (A) Truth Table, AND

| A | B | OUT=X |
|---|---|---|
| 0 | 0 | 0 |
| 0 | 1 | 0 |
| 1 | 0 | 0 |
| 1 | 1 | 1 |

(B) Symbolic Notation, AND (C) Dynamic AND Circuit (D) Static Complementary AND Circuit (A) Truth Table, NOR

| A | B | OUT=X |
|---|---|-------|
| 0 | 0 | 1 |
| 0 | 1 | 0 |
| 1 | 0 | 0 |
| 1 | 1 | 0 |

(B) Symbolic Notation, NOR (C) Dynamic NOR Circuit (D) Static Complementary NOR Circuit (A) Truth Table, OR

| A | B | OUT=X |
|---|---|---|
| 0 | 0 | 0 |
| 0 | 1 | 1 |
| 1 | 0 | 1 |
| 1 | 1 | 1 |

(B) Symbolic Notation, OR

X=A+B (C) Dynamic OR Circuit (D) Static Complementary OR Circuit (A) Truth Table, XOR

| A | B | OUT=X |
|---|---|---|
| 0 | 0 | 0 |
| 0 | 1 | 1 |
| 1 | 0 | 1 |
| 1 | 1 | 0 |

(B) Symbolic Notation, XOR $X = A \oplus B$ (C) Dynamic XOR Circuit (D) Static Complementary XOR Circuit (A) Truth Table, XNOR

| A | B | OUT=X |
|---|---|-------|
| 0 | 0 | 1 |
| 0 | 1 | 0 |
| 1 | 0 | 0 |
| 1 | 1 | 1 |

(B) Symbolic Notation, XNOR (C) Dynamic XNOR Circuit (D) Static Complementary XNOR Circuit

INDEPENDENTLY-DOUBLE-GATED COMBINATIONAL LOGIC

CROSS-REFERENCES TO RELATED APPLICATIONS

This application is a Continuation-In-Part of U.S. patent application Ser. No. 10/613,169 filed Jul. 3, 2003 (now U.S. Pat. No. 7,015,547, issued on Mar. 21, 2006), entitled "Multi-Configurable Independently Double-Gated MOSFET," which is incorporated here by reference.

U.S. patent application Ser. No. 10/719,119 filed Nov. 21, 2003 (now U.S. Pat. No. 7,019,342, issued on Mar. 28, 2006), entitled "Double-gated transistor circuit," is incorporated here by reference.

U.S. patent application Ser. No. 11/273,362 filed Nov. 14, 2005 (now U.S. Pat. No. 7,154,135, issued on Dec. 26, 2006), entitled "Double-gated transistor circuit," is incorporated here by reference.

FIELD OF THE INVENTION

The present invention relates generally to the composition and manufacture of digital gate logic circuitry using charge transfer devices having plural gate levels and, more specifically, to a family of AND, NAND and Exclusive-OR gates.

BACKGROUND OF THE INVENTION

In the dynamic industry of circuit design, the goal is always to develop components that are smaller and more efficient. The basic module of all digital circuits is the logic gate which performs according to simple Boolean expressions. Unlike analog circuits, digital circuits have only a few discrete input states. A Boolean variable typically has one of two values, signified as 1 or 0, and often referred to as TRUE or FALSE, respectively. In an electronic system these logic states may indicate that either a voltage is present to represent a value of 1, or no voltage is present to represent a value of 0. A gate's operation may be described in mathematical terms and Boolean algebra may be used for analyzing a circuit having gates. A gate is a simple digital circuit that produces a specific, predictable output condition based solely upon each possible combination of input conditions; hence logic implemented by gates is also referred to as combinational logic. Other than combinational logic, there is sequential logic wherein the output of a functional block also depends not only upon the inputs at a given time but also upon the prior states of the outputs of that functional block. When gates are connected to other gates, they are able to perform complex logical and arithmetic operations.

The simplest of logic functions are the Switch and the Inverter. A Switch has two states, being either Closed or Open; in other words, the input and output of a Switch are either connected to each other or not connected. In a two-state system of logic, an Inverter serves to change the state, namely, to invert 1's to 0's, and vice versa. These devices may be considered as degenerate logic elements, but they have their places.

Perhaps the most basic of gated logic elements is the OR-gate as described in U.S. patent application Ser. No. 10/719,119, which may be referred to here as the '119 application. It should be noted here that the term "OR" without a qualifier is generally taken to mean Inclusive-OR. In its most basic form, this type of OR-gate accomplishes the function of disjunction, that is, it outputs a value of 1 if any one or more of its inputs has a value of 1. The Inclusive-OR gate will have an output value of 0 only if all of the values at its input are 0. When the output state of an OR-gate is inverted, the combined result is a NOR-gate, which has been addressed in U.S. patent application Ser. No. 11/273,362.

A second of the most common gates in digital logic design is the AND gate which performs the Boolean operation of conjunction. The AND gate outputs a value of 1 only if all of its input values are 1. If any one or more of the inputs to an AND-gate have a value of 0 then its output will be 0. An AND-gate which has had its output state inverted is referred to as a NAND-gate.

Of the logic elements having only two inputs, the remaining one is the Exclusive-OR gate, commonly referred to as an XOR-gate. The XOR-gate assumes an output state of 1 if only one of its inputs is 1, and the other is a 0. The inverted form of the XOR-gate is called an XNOR-gate (or alternately, an XAND gate) and will have a 1 at its output for either of the conditions wherein both inputs are the same, that is, both inputs are 1 or both are 0. The XOR function is necessary to accomplish the arithmetic operation of addition, which is a precursor to an arithmetic multiplier.

Each of these two-input logic functions may be implemented with gates having relatively few components. For example, the function of an OR-gate may be accomplished by two diodes in parallel or by two transistors in parallel. In the transistor example, when a gate voltage is present at the gate of one or both of the transistors a 1 value will result at the output of the OR-gate. An AND-gate may be constructed with two transistors in series, where a voltage is required at the gates of both transistors in order to produce a value of 1 at the output of the AND-gate. Implementation of the XOR function is a bit more complex. As can be expected, a vast number of OR-gates, AND-gates and other logic elements are required to construct the complex circuitry of a computer system. Because of this, even slight reductions in the size of a single logic gate would result in significant improvements to the overall architecture of a computer system.

It would be an advancement in the art to provide an AND-gate, an OR-gate, an XOR-gate, or any other logic circuit element that is smaller, more efficient, and has superior gate voltage control. Such devices are disclosed and claimed herein.

BRIEF SUMMARY OF THE INVENTION

The present invention utilizes Double-Gated (DG) Field Effect Transistors (FETs) having independent gate control to accomplish the function of two parallel single-gated transistors with only a single double-gated transistor. Wherever these Independent Double-Gated (IDG) FETs can be used, a transistor is effectively eliminated, thereby producing a smaller, more efficient logic device.

The IDG transistor, which was originally described in U.S. patent application Ser. No. 10/613,169 (referred to as the '169 application), includes a Bottom Gate (BG) and an independently controllable Top Gate (TG). Construction of related FETs suitable for the present invention have been described in the '119 application. From a construction point of view, the bottom gate is disposed on a substrate and a dielectric layer disposed on the bottom gate. The source, channel, and drain are disposed on the dielectric layer to provide an electron flow controlled by gate voltages. In one embodiment, the channel may have a U-shaped cross-sectional area to increase the channel length and gate control. A gate insulator is disposed on the channel with a top gate disposed on the gate insulator. First and second insulating spacers are disposed on opposing sides of the top gate such that the first spacer is between the source and the top gate and the second spacer is between the drain and the top gate. The transistor may be surrounded with additional spacers and an isolation layer to provide full isolation. The source includes a source extension that extends proximate to the first spacer and couples to the channel. Similarly, the drain includes a drain extension that extends proximate to the second spacer and couples to the channel. The spacers shield the channel from the field effect of the source and drain and further resist compression of the channel by the source and drain.

First and second logic inputs are coupled to the top and bottom gates of input transistors which produce an output of a basic logic element at the drain. A change in the state of an input to either the top or bottom gate will result in a change in the voltage at the drain when appropriate logic conditions are met according to the configuration of the particular logic function cell. For dynamic logic functions, the drain may be precharged to either a high or low voltage. Static CMOS logic functions are included as well.

Consolidation of logic functions through the use of Independent Double-Gated transistors reduces size, provides lower power dissipation, provides higher speed, and reduces instances of parasitic capacitance. Additional aspects and advantages of this invention will be apparent from the following detailed description of preferred embodiments, which proceeds with reference to the accompanying drawings.

BRIEF DESCRIPTION OF THE DRAWINGS

The particular features and advantages of the invention briefly described above as well as other objects will become apparent from the following description taken in conjunction with the accompanying drawings, in which.

DETAILED DESCRIPTION OF THE INVENTION

A discussion of an OR-gate architecture that combines the function of two parallel transistors into a single transistor can be found in the '119 application. The related construction of a NOR-gate is addressed in the '362 application. The discussion presented here will focus on other members of the family of logic gates, namely, AND, NAND, XOR, and XNOR. Additionally, complementary static versions of these logic cells will be presented in addition to dynamic versions.

Complementary MOS (CMOS) logic functions may be designed using either positive or negative logic depending up on whether a designer thinks in terms of 1's or 0's. Because CMOS is "Complementary" MOS, both positive and negative versions will be required, the positive implemented using NMOS transistors, and the negative using PMOS transistors. From the design of one logic form, the other will be created by use of DeMorgan's Theorem, which states that (A+B)'=A'*B', in other terms, NOR(A, B)=AND(INV(A), INV(B)). Here the prime symbol ['] indicates the Complement or INVerse of an element,

[+] is used for the OR function, also known as Summation, and

[*] signifies the AND, or Product, function.

As a process, DeMorgan's Theorem is implemented by:
1. complementing (inverting) all variables;
2. exchanging all AND operators to OR's, and all OR's to AND's; then
3. complementing the entire expression.

In the construction of complex logic functions, it is sometimes useful to note that any function can be generated by some combination of NAND and NOR gates. Each of these two basic functions may also be used as a simple inverter stage either by tying all inputs of the individual gate together, or by disabling all but one active input and tying all other inputs to a '1' state for a NAND, or a '0' state for a NOR.

The discussion will now turn to FIGS. 1-20 where a double-gated transistor suitable for use in the combinational logic gate circuits of the present invention is described in detail. One of skill in the art will appreciate that a double-gated field effect transistor of various configurations may also be used.

Figure 1:
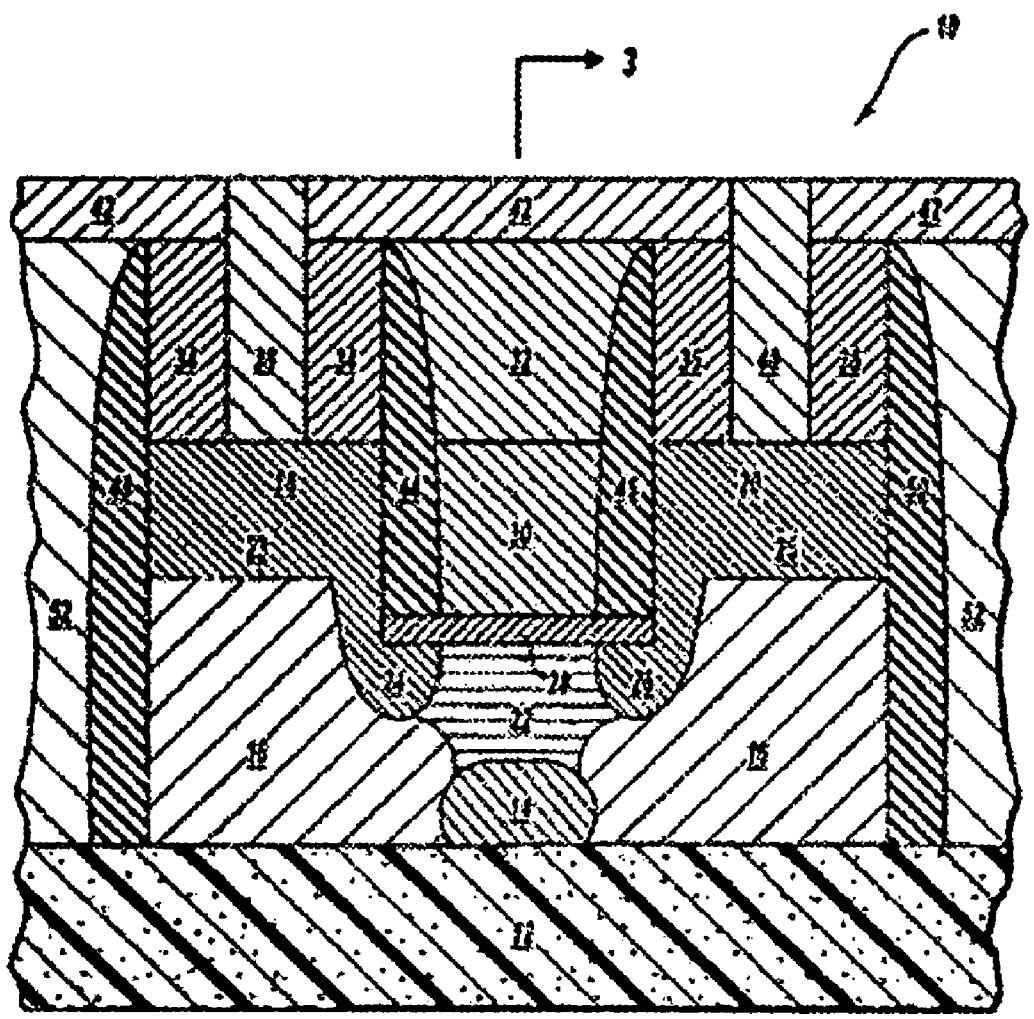
FIG. 1 is a cross-sectional view of an embodiment of a transistor of the present invention.

Referring to FIG. 1 a cross-sectional view of one embodiment of the double-gated transistor 10 of the present invention is shown. The illustrated transistor 10 discussed herein is an N-channel device, but may as well be embodied as a P-channel device as can be appreciated by one of skill in the art. The transistor 10 includes a substrate 12 that may be formed of any number of suitable materials. The substrate 12 may include silicon and a buried insulator such as silicon dioxide which is commonly referred to as a buried oxide (BOX) layer.

A bottom gate 14 is disposed on the substrate 12 and includes a low resistance doped silicon material. The bottom gate 14 is highly doped, such as by ion implantation, to create a P+ bottom gate in the N-channel configuration. The transistor 10 includes a high-resistivity silicon on insulator (SOI) layer 16 that is preferably a P-type material. The SOI layer 16 may be formed by any number of available methods including SmartCut bonded, SIMOX, metal-induced poly-recrystallization, and so forth.

The source 18, drain 20, and channel 22 form a current flow path in accordance with MOSFET practice. The source 18 and drain 20 may be formed of any suitable N+materials in an N-channel configuration. Formation of the source 18 and drain 20 may include deposition of an additional material layer or doping of the existing dielectric layer 16.

In a depletion type MOSFET, the channel 22 may include a layer of material that is the same as the source 18 and drain 20, such as an N-type material in the given example. The gate voltage can reduce the channel current by depleting carriers or increase the channel current by increasing carriers. In an enhancement type MOSFET, the channel 22 is an area extending into the P-type material of the dielectric layer 16. Application of a positive gate voltage pushes away the holes in the P-type material and attracts the moveable electrons in the N-type source 18 and drain 20 to form a channel 22. In FIG. 1, the channel 22 is defined as the area between the source 18, drain 20, bottom gate 14, and gate dielectric insulator 28. The channel 22 may therefore be an undoped region of the dielectric layer 16. As can be appreciated, the present invention is applicable to either depletion or enhancement type MOSFETs.

The source 18 includes a main body 23 that represents the majority of the source 18 and a source extension 24 that extends from the main body 23 to couple with the channel 22. The source extension 24 has significantly less cross-sectional area than the main body 23. Similarly, the drain 20 includes a main body 25, which is the majority of the drain 20, and a drain extension 26 that extends from the main body 25 and couples to the channel to enable electron flow. The drain extension 26 has significantly less cross-sectional area than the main body 25.

The extensions 24, 26 serve to increase the distance of the main bodies 23, 25 from the channel 22 to reduce the short-channel effect created by the drain 20. However, in reducing the short-channel effect a resistance is created in the extensions 24, 26. This is acceptable given the superior gate control enabled by the reduced field effect. The extensions 24, 26 may be configured in various shapes in coupling the main bodies 23, 25 to the channel 22.

A gate dielectric insulator 28 is disposed on the channel 22 and a top gate 30 is disposed on the gate dielectric insulator layer 28. The gate dielectric insulator 28 is a dielectric, such as silicon dioxide, that insulates the top gate 30 from the channel 22 as is well known in MOSFET architecture. The top gate 30 may be formed of any suitable metallic material, a few examples of which are Mo, W, Al, or TiN. A local interconnect 32 is disposed on the top gate 30 and may include any number of various materials, including Al.

The transistor 10 further includes polish stop pad layers 34, 36 that are disposed on the source 18 and drain 20 respectively. The pad layers 34, 36 are formed of a dielectric material. Extending through each pad layer 34, 36 are one or more contact layers 38, 40 that couple to a respective source 18 and drain 20. An Interlevel Dielectric Layer (ILD) 42 is disposed on the pad layer 34, 36 with allowance for the contact layers 38, 40 to extend through to enable contact.

First and second spacers 44, 46 are disposed within to prevent contact between the top gate 30 and the source 18 and drain 20 as shown. The spacers may include any number of insulating materials such as silicon nitride or silicon oxide. The spacers 44, 46 further extend to prevent contact between the local interconnect 32 and the source and drain 18, 20.

As illustrated, the majority of the source 18 and drain 20 is disposed on one side of a corresponding spacer 44, 46. The source and drain extensions 24, 26 extend proximate to the spacers 44, 46 and couple to the channel 22. The disposition of the spacers 44, 46 and the extensions 24, 26 shield the channel 22 from the field effect of the source and drain 18, 20 while still providing contact to enable electron flow. As transistor size is reduced, the source and drain voltages interfere with the gate voltage and inhibit gate control of the channel 22. The present invention provides improved gate control of the channel 22 by limiting the field effect and capacitance of drain 20 voltages.

In one implementation, the pads 34, 36 include a different dielectric material than that of the spacers 44, 46. Thus, if the spacers 44, 46 are formed of a silicon nitride then the pads 34, 36 are formed of silicon oxide. Conversely, if the pads 34, 36 include a silicon nitride, then the spacers 44, 46 include silicon oxide.

The transistor 10 further includes third and fourth spacers 48, 50, formed of the same insulating material of the first and second spacers 44, 46. The third and fourth spacers 48, 50 extend vertically along the peripheral edges of the transistor 10. The spacers 48, 50 serve to isolate the transistors 10 from each other and provide radiation resistance and may be referred to as exterior spacers. As can be appreciated, the spacers 48, 50 may extend, alone or in conjunction with other spacers, to surround the components of the transistor 10. An insulating layer 52, such as a Shallow Trench Isolation (STI) oxide, may further be disposed around the transistor 10 to provide further isolation. The transistor 10 is encapsulated within the insulating layer 52, spacers 48, 50, and ILD layer 42 to optimize performance.

The transistor architecture of the present invention provides a four-terminal device that allows the source 18, drain 20, bottom gate 14, and top gate 30 to be biased independently. The bottom gate 14 and the top gate 30 may be wired out to the left or right based on design constraints. Additional conducting and dielectric layers may be disposed on the transistor 10 based on design configurations.

Figure 2:
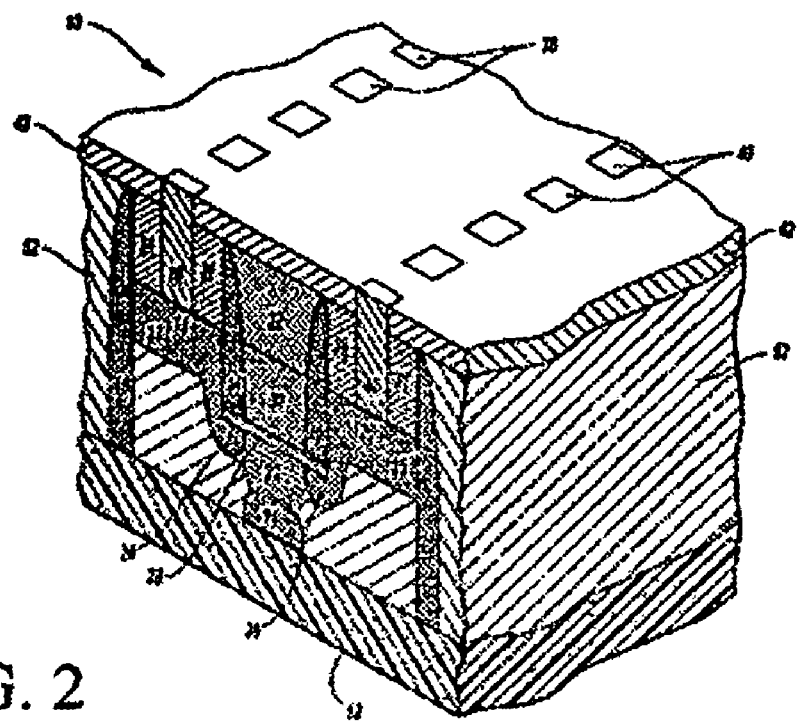
FIG. 2 is an isometric view of the transistor of FIG. 1.

Referring to FIG. 2, an isometric view of the transistor 10 illustrates the upper surface of the ILD layer 42. As shown, the contact layers 38, 40 extend through the ILD layer 42 to enable access to the source 18 and drain 20. The contact layers 38, 40 may provide any number of accesses to the source 18 and drain 20 based on design preferences.

Figure 3:
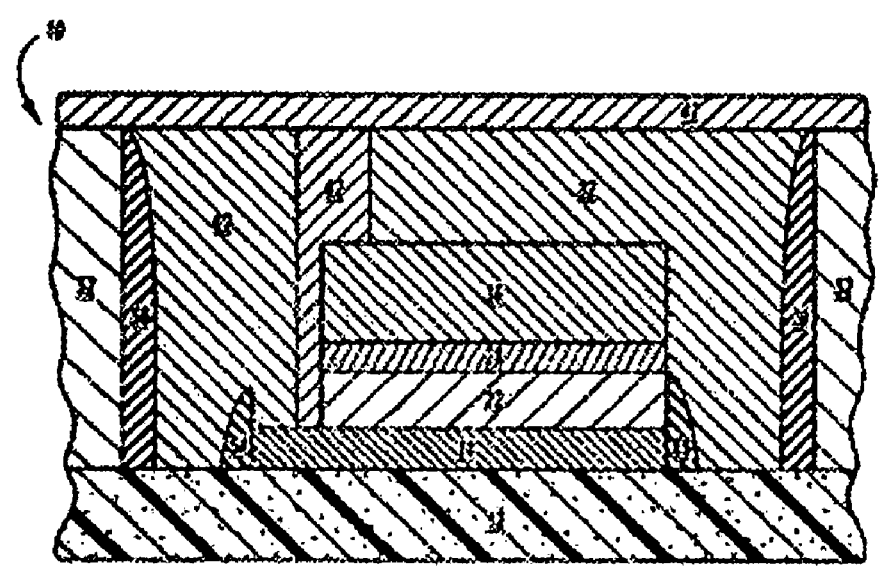
FIG. 3 is a cross-sectional view of the length of the transistor of FIG. 1 along line 3-3.

FIG. 3 provides a cross-sectional view of the transistor 10 taken along the length 3-3 illustrated in FIG. 1. The transistor 10 is a four terminal, double-gated device with each gate having an independent bias. This will be referred to as an Independently-Double-Gated (IDG) transistor. The substrate 12, bottom gate 14, channel 22, gate dielectric insulator 28, top gate 30, conducting layer 32, and ILD layer 42 are shown vertically disposed relative to one another. Further shown is a second local interconnect 60 that couples to the bottom gate 14 to provide an independent bias to the bottom gate 14. The second local interconnect 60 is the same material as the first local interconnect 32. The first and second local interconnects 32, 60 together provide the local interconnect for the top and bottom gates 14, 30.

The second local interconnect 60 is separated from the first local interconnect 32 by an STI insulator 62. The insulator 62 may be formed of any suitable material such as an oxide or nitride. In this manner, the top gate 30 and the bottom gate 14 are able to be independently biased. As shown, the top gate 30 is offset relative to the bottom gate 14 to enable its separate bias. The offset is accomplished by appropriately positioning the top gate mask along the x-axis during fabrication.

Fifth and sixth spacers 64, 66 are disposed adjacent to the bottom gate 14 to insulate the bottom gate 14 as needed. In the Independently-Double-Gated device, the sixth spacer 66 separates the bottom gate 14 and the channel 22 from the first local interconnect 32.

Seventh and eighth spacers 68, 70 are disposed to isolate the transistor 10. The spacers 68, 70 may be extensions of the spacers 48, 50 that surround the transistor 10. The insulating layer 52 surrounds and further isolates the transistor 10.

Figure 4:
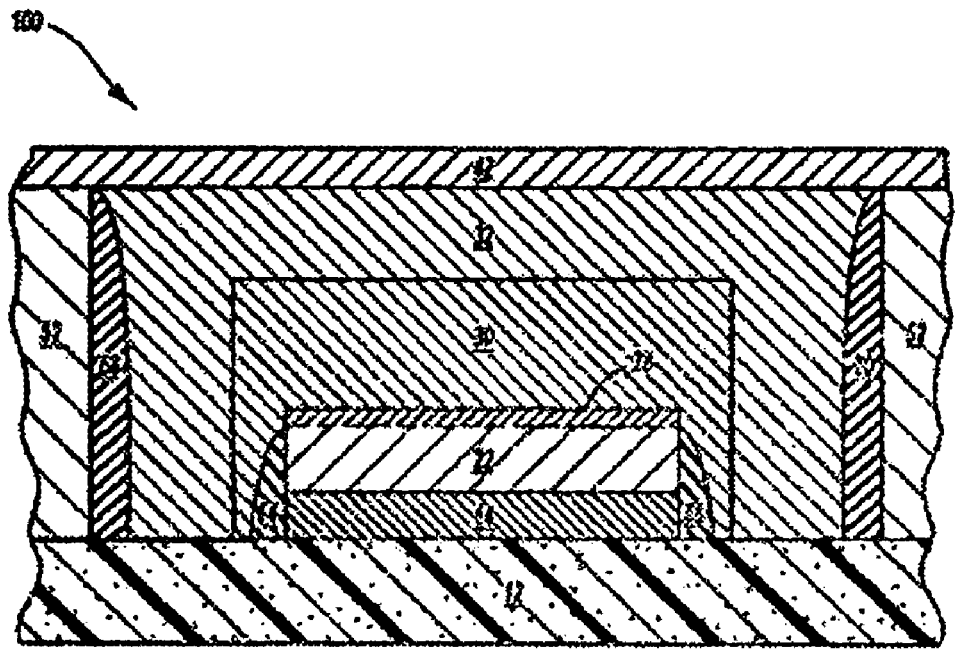
FIG. 4 is a cross-sectional view of the length of an alternative embodiment of a transistor.

An alternative embodiment of a transistor 100 is shown in FIG. 4, wherein the bottom gate 14 is electrically isolated by the spacers 64, 66 and the dielectric layer 16. This embodiment is referenced herein as a Single-Gated (SG) transistor. The top gate 30 extends over the spacers 64, 66 and covers the gate dielectric insulator 28, channel 22, and bottom gate 14. A second local interconnect 60 and an insulator 62 are not required and not present in this embodiment.

In manufacture, a top gate mask is used that extends over a larger area than the bottom gate 14. The top gate 30 and the bottom gate 14 are aligned relative to one another along the x-axis so that the bottom gate 14 is within the perimeter of the top gate 30.

Figure 5:
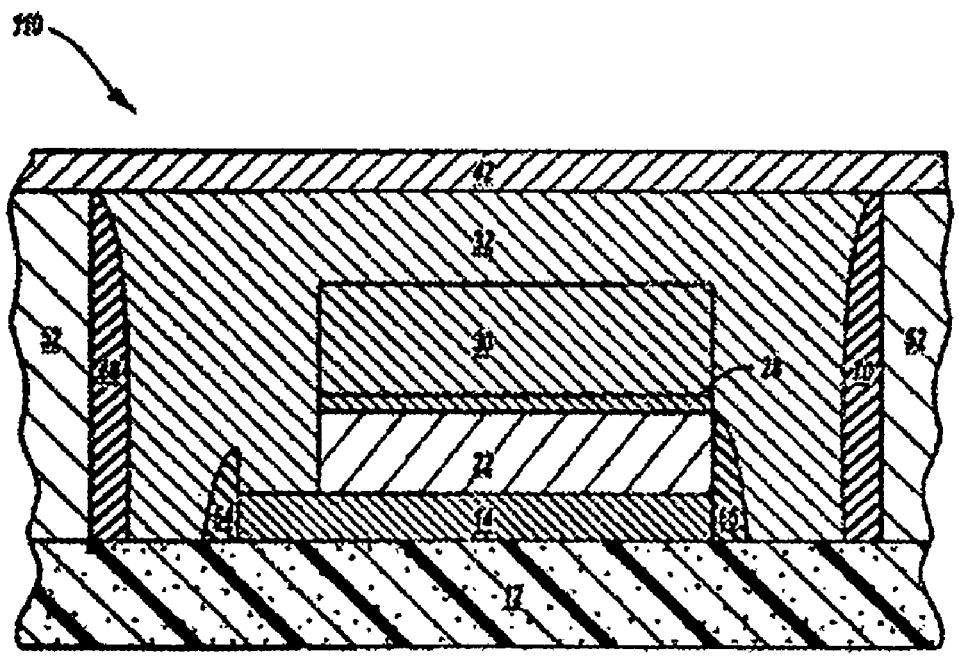
FIG. 5 is a cross-sectional view of the length of an alternative embodiment of a transistor.

Referring to FIG. 5, another alternative embodiment of a transistor 110 of the present invention is shown. The transistor 110 is a Double-Gated (DG) device wherein the top and bottom gates 14, 30 are shorted to one another. The top gate 30 and the bottom gate 14 are disposed in an offset relationship similar to that of FIG. 3. The transistor 110 does not include a second local interconnect 60 or an insulator 62. Instead, the first local interconnect 32 occupies the space formerly reserved for the second local interconnect 60 and insulator 62 and couples with both the top and bottom gates 14, 30. An advantage of the present invention is that the Double-Gated application occupies the same footprint as a three terminal device and incurs no layout penalty.

By merely repositioning the top gate and bottom gate masks relative to one another in the x-axis, the presently invented transistor provides an Independently-Double-Gated device, a Single-Gated transistor, or a Double-Gated MOSFET. As such, the present invention provides a flexible transistor architecture that is adjusted by mask positioning to create different transistor configurations.

Figure 6:
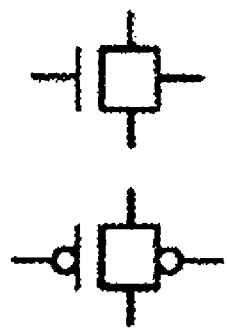
FIG. 6 is a schematic representation of the Independent Double-Gated embodiment of FIG. 3.
Figure 7:
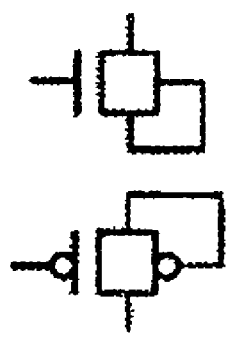
FIG. 7 is a schematic representation of the Single Gate embodiment of FIG. 4.
Figure 8:
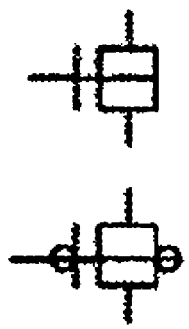
FIG. 8 is a schematic representation of the Double-Gated embodiment of FIG. 5.

FIGS. 6, 7, and 8 depict schematic representations of the transistor embodiments corresponding to FIGS. 3, 4, and 5. The Independently-Double-Gated device of FIG. 6 provides independent bias to the top gate 30 and the bottom gate 14. FIG. 7 illustrates a Single-Gated transistor wherein the bottom gate 14 is effectively grounded, while FIG. 8 illustrates a Double-Gated device wherein the bottom gate 14 and the top gate 30 are shorted to one another. As is well known in the art, each device represented in FIGS. 6-8 has specific uses that are suitable for different applications.

Figure 9:
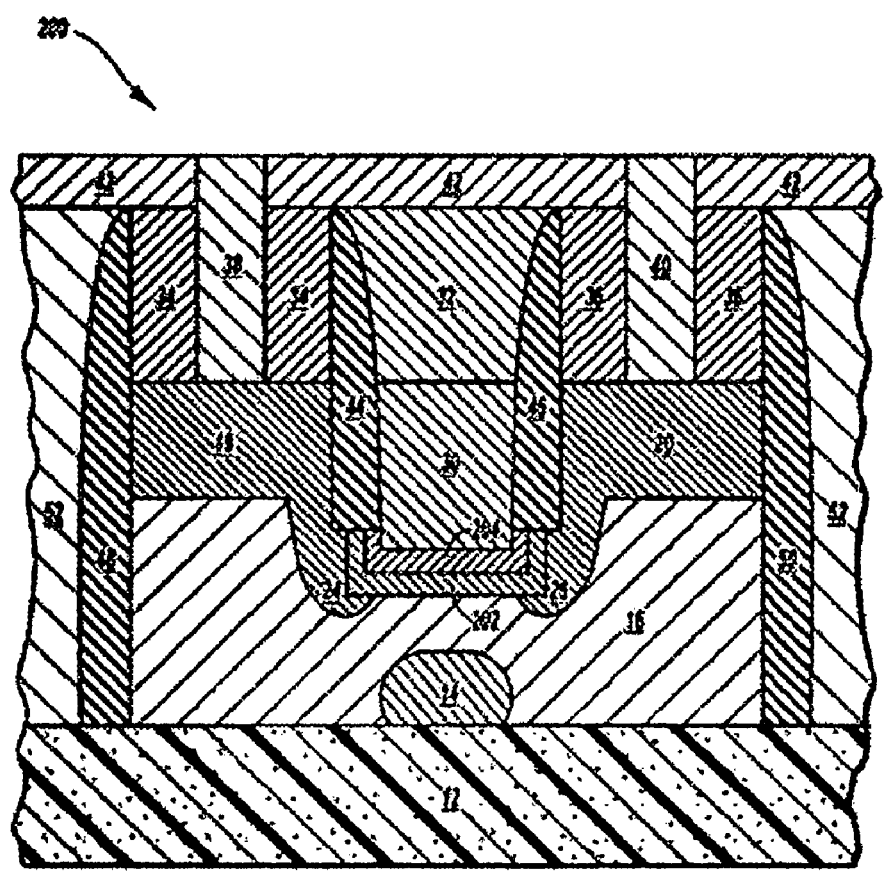
FIG. 9 is a cross-sectional view of an alternative embodiment of a transistor of the present invention.

In the cross-sectional view of FIG. 9 an alternative embodiment of a transistor 200 of the present invention is shown. The transistor 200 is similar to that previously illustrated in FIG. 1 in that the source 18 and drain 20 each include a respective extension 24, 26 coupled to a channel 202. As before, spacers 44, 46 are disposed between the majority of the source 18 and drain 20 and the channel 202 to reduce the field effect on the channel 202.

The channel 202 may be U-shaped which increases the channel length and the electron flow path. The increased channel length allows for greater gate control over the channel 202. Thus, the gate control over the channel 202 is significantly improved at the expense of an increased channel length.

A gate dielectric insulator 204 is disposed on the channel 202 and may also be U-shaped as it conforms to the channel 202. Alternatively, the gate dielectric insulator 204 may be shaped in other forms and still be within the scope of the present invention.

Other elements of the transistor 200 operate in a similar fashion to that previously described above. A cross-sectional view of the length of the transistor 200 would be similar to that shown in FIG. 3. As can be appreciated, the view shown in FIG. 3 would be adjusted to account for the position of the channel 202 and gate dielectric insulator 204.

Figure 10:
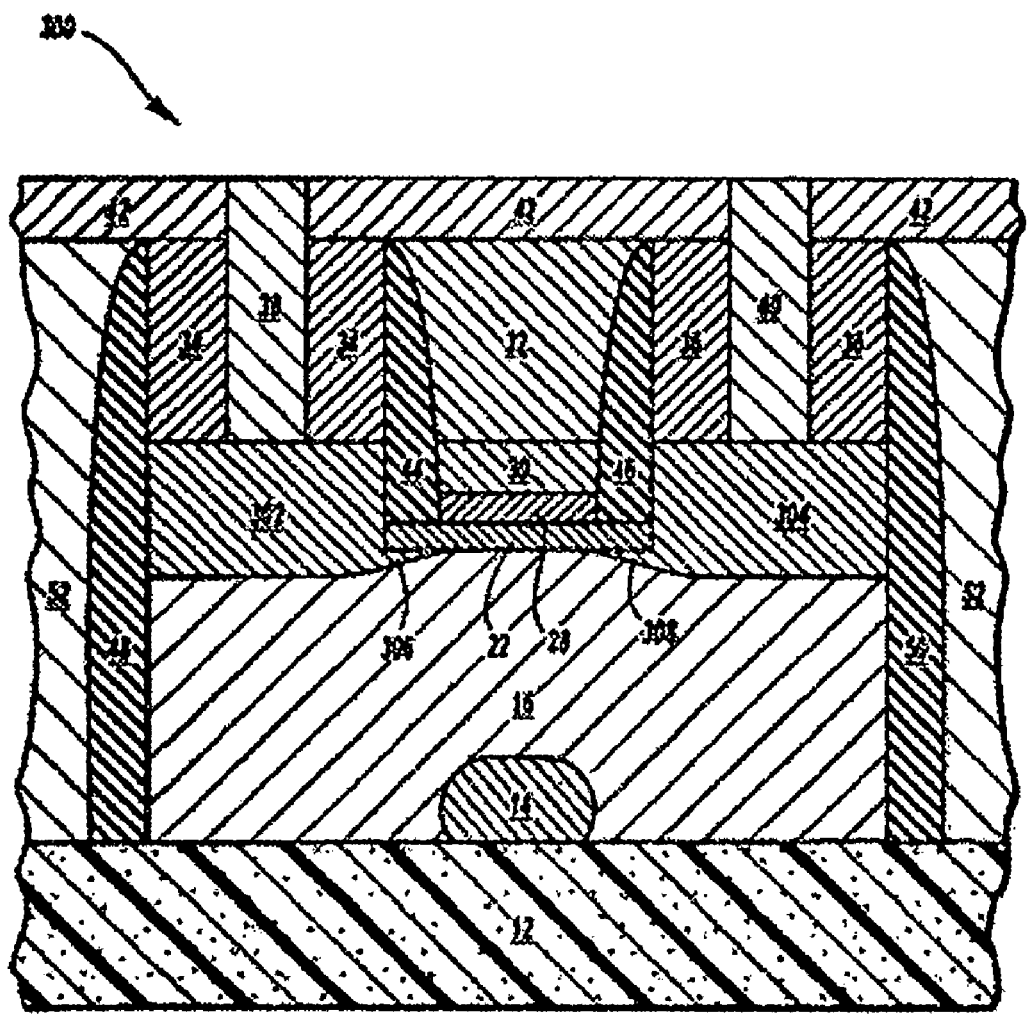
FIG. 10 is a cross-sectional view of an alternative embodiment of a transistor of the present invention.

Referring to FIG. 10, there is shown a cross-sectional view of an alternative embodiment of a transistor 300 of the present invention. As illustrated, the transistor 300 is similar to the embodiment of FIG. 1 and primarily differs in the shape of the source 302, drain 304, and their corresponding extensions 306, 308. The source 302 and drain 304 are vertically aligned closer to the channel 22 than in the previous embodiment. As such, the extensions 306, 308 are shorter and extend primarily in a horizontal direction to couple with the channel 22. The shorter extensions 306, 308 reduce the resistance in the electron flow path. As in previous embodiments, spacers 44, 46 are disposed between the channel 22 and the majority of the source 302 and drain 304. Accordingly, the channel 22 is partially shielded to reduce the field effect and provide superior gate control.

Figure 11:
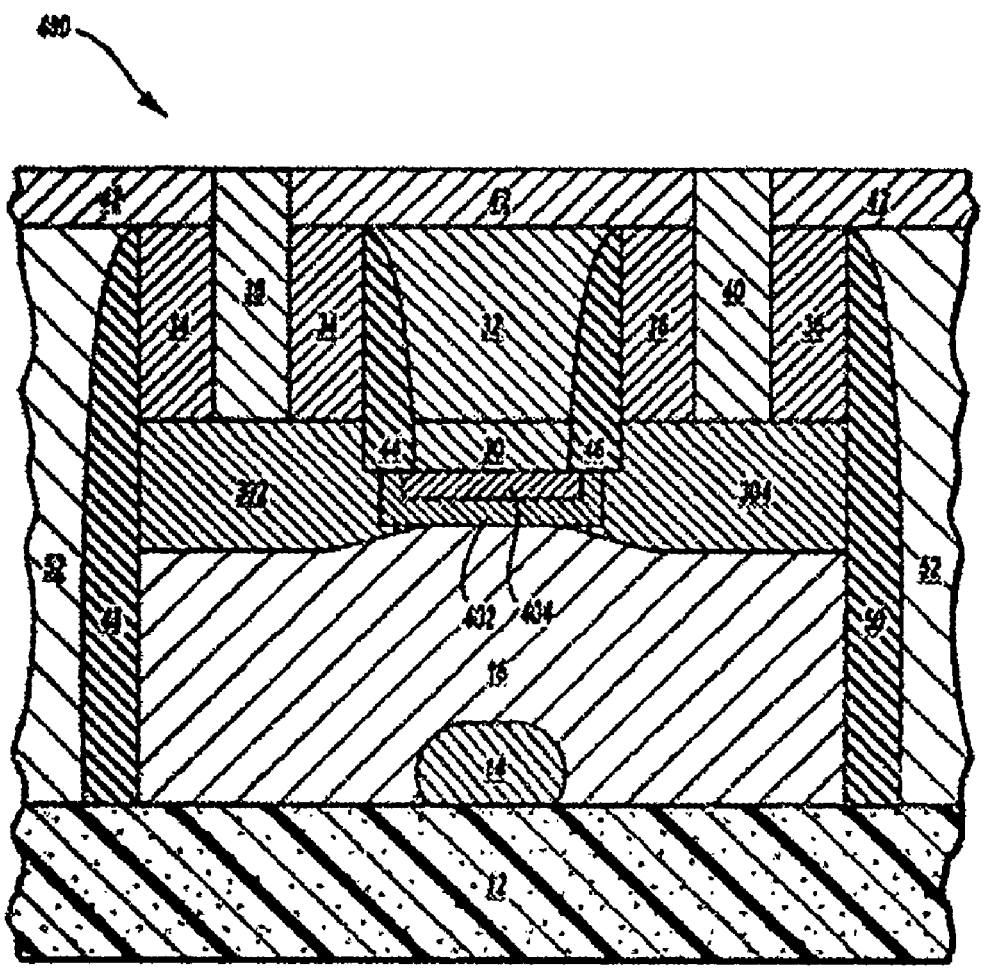
FIG. 11 is a cross-sectional view of an alternative embodiment of a transistor of the present invention.

FIG. 11 shows a cross-sectional view of an alternative embodiment of a transistor 400 of the present invention. The transistor 400 is similar to that of FIG. 10 with the primary difference being the shape of the channel 402. The channel 402 is in a U-shape similar to the embodiment of FIG. 9. The increased channel length improves the gate control while increasing the resistance experienced in the flow path. A gate dielectric insulator 404 is disposed on the channel 402 and may have a planar configuration as shown or have a U shape.

Transistors 200, 300, 400 may also be referred to as a configurable transistor in that the alignment of the top gate and bottom gate determines the terminal connections, electrical behavior, and threshold voltage of the device. Thus, each of the transistors 200, 300, 400 may be embodied as any of an Independently-Double-Gated device, Single-Gated transistor, or a Double-Gated MOSFET as explained in reference to FIGS. 3 to 8.

Figure 12:
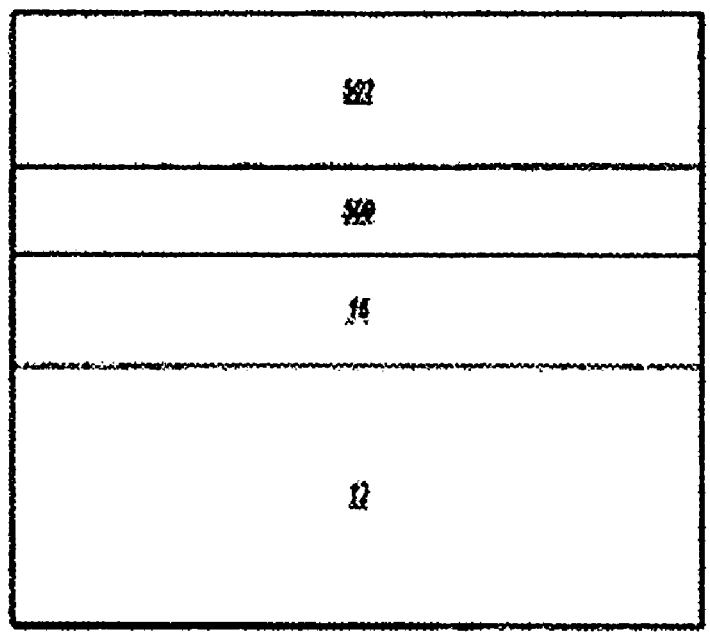
FIG. 12 is a cross-sectional view of layers used in the fabrication of the transistor of FIG. 1.

Referring to FIG. 12 to, a method for manufacturing the transistor 10 of FIG. 1 is shown. One of skill in the art will appreciate that various processes may be used to create a transistor structure and are included within the scope of the invention. The method described herein is exemplary and is for illustrative purposes only.

With more specific reference to FIG. 12, a cross-sectional view of preliminary layers used in fabrication is shown. The transistor 10 includes a substrate layer 12 that may be formed of any number of resistive materials suitable for the present invention. In one implementation, the substrate 12 may include a lower layer of silicon and a buried oxide (BOX) layer disposed thereon. A SOI layer 16, such as crystalline silicon, is formed on the substrate layer 12 by any known method. A source/drain layer 500 is formed on the substrate layer 12 and may also include crystalline silicon that is doped with ion implants to form a N+ material. The source/drain layer 500 may be subjected to a metallization step wherein a silicide is applied and removed to improve performance. Typically, a silicide such as TiSi, MoSi, or CoSi, is sputtered onto the surface of the source/drain layer 500 and then stripped away to increase electron mobility. A dielectric layer 502 is formed on the source/drain layer 500. The dielectric layer 502 includes either silicon nitride or silicon oxide.

Figure 13:
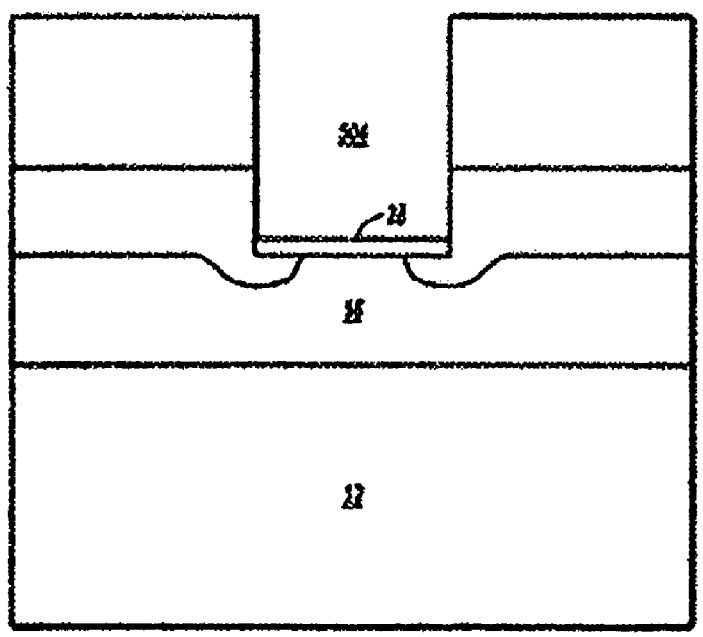
FIG. 13 is a cross-sectional view of the device of FIG. 12 after formation of a trench.

FIG. 13 shows the formation of a trench 504 in the dielectric layer 502 and the source/drain layer 500. The trench 504 is etched in accordance with an applied trench mask to form the main bodies 23, 25, of the source 18, and drain 20.

Figure 14:
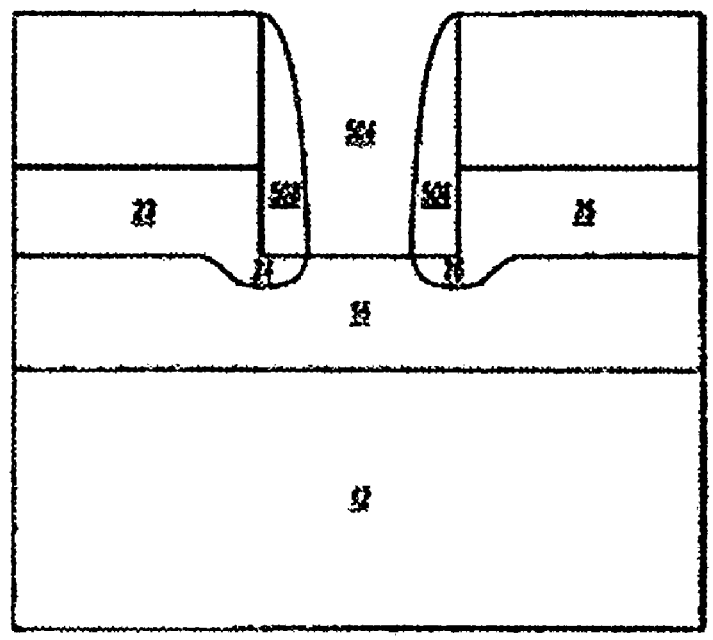
FIG. 14 is a cross-sectional view of the device of FIG. 13 device after formation of doped sidewalls.

Looking to FIG. 14, a solid source doping technique is used to form the source and drain extensions 24, 26. A layer of a heavily doped solid is formed within the trench 504 and then etched to provide doped sidewalls 506. The doped sidewalls 506 act as a source to infuse a dopant to the SOI layer 16. The regions of the SOI layer 16 proximate to the sidewalls 506 become the N+ source and drain extensions 24, 26. In an alternative technique, the extensions 24, 26 may be formed by conventional ion implantation.

Figure 15:
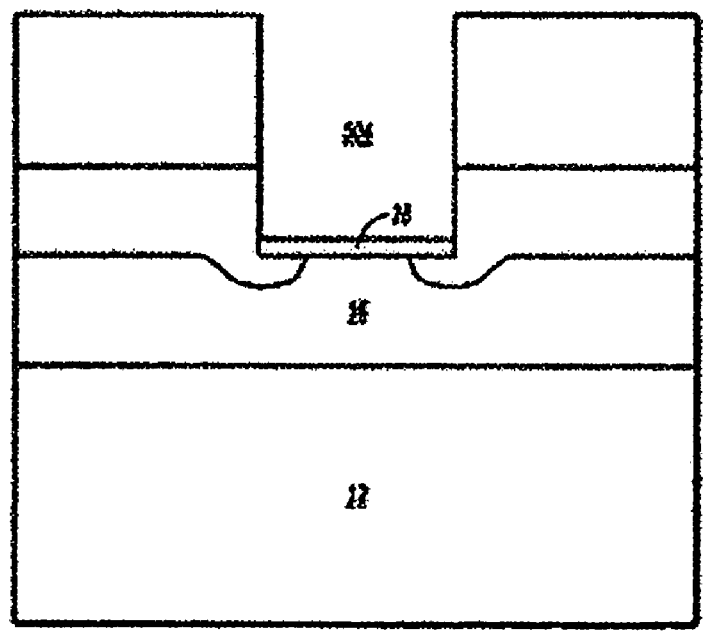
FIG. 15 is a cross-sectional view of the device of FIG. 14 after removal of the doped sidewalls and formation of a gate dielectric insulator.
Figure 16:
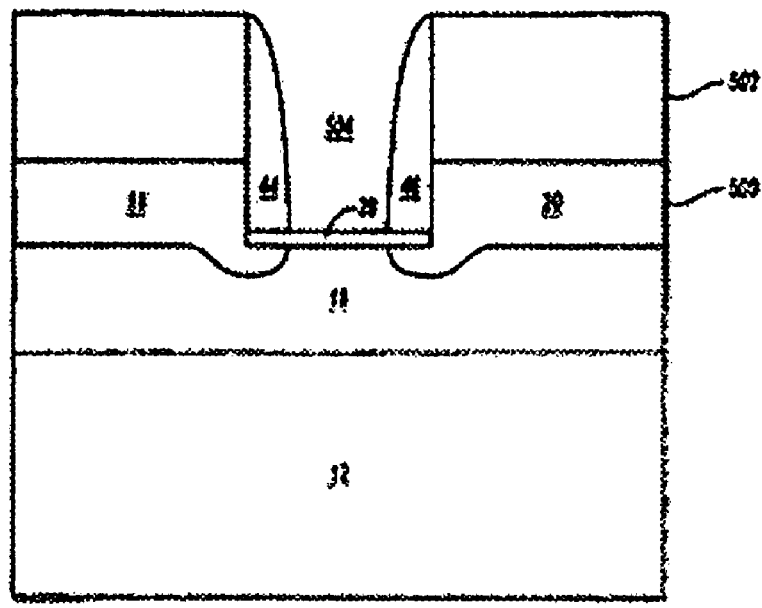
FIG. 16 is a cross-sectional view of the device of FIG. 15 after formation of spacers.

The doped sidewalls 506 are removed in FIG. 15 and a dielectric layer is formed within the trench 504 and etched to form a gate dielectric insulator 28 on the trench bottom. A layer of silicon nitride is formed within the trench 504 in FIG. 16 and etched to form first and second spacers 44, 46.

Figure 17:
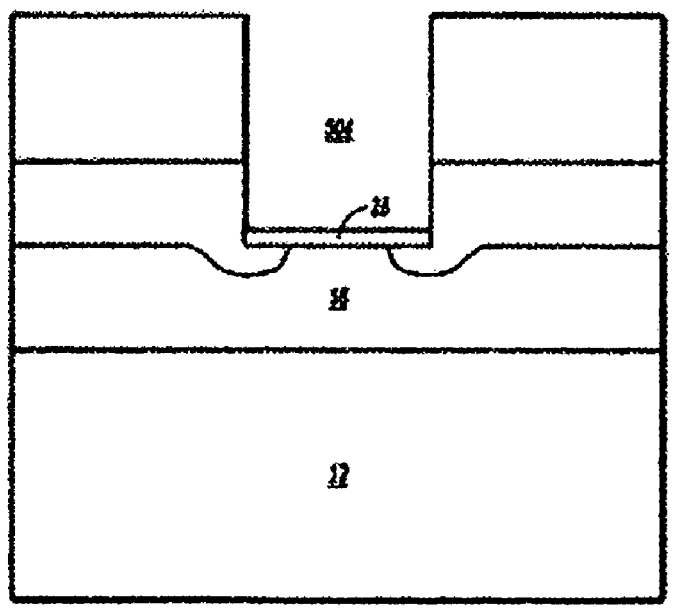
FIG. 17 is a cross-sectional view of the device of FIG. 16 after formation of a bottom gate.

In FIG. 17, the SOI layer 16 is doped with high level ion implants to form a P+ bottom gate 14. The ion implants are directed through the trench 504 to contact the SOI layer 16 and form the bottom gate 14 in the appropriate location. A channel 22 is defined as the proximate area between the bottom gate 14, extensions 24, 26, and gate dielectric insulator 28.

Figure 18:
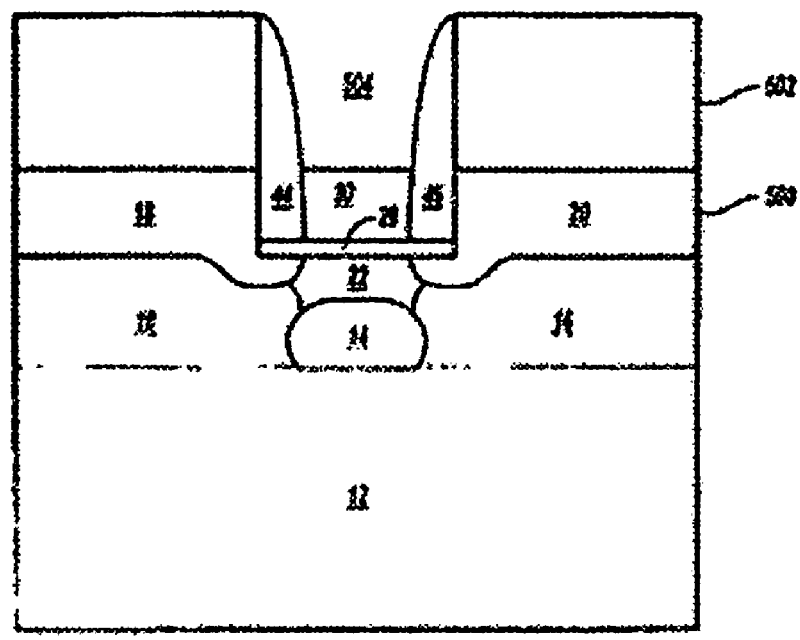
FIG. 18 is a cross-sectional view of the device of FIG. 17 after formation of a top gate.
Figure 19:
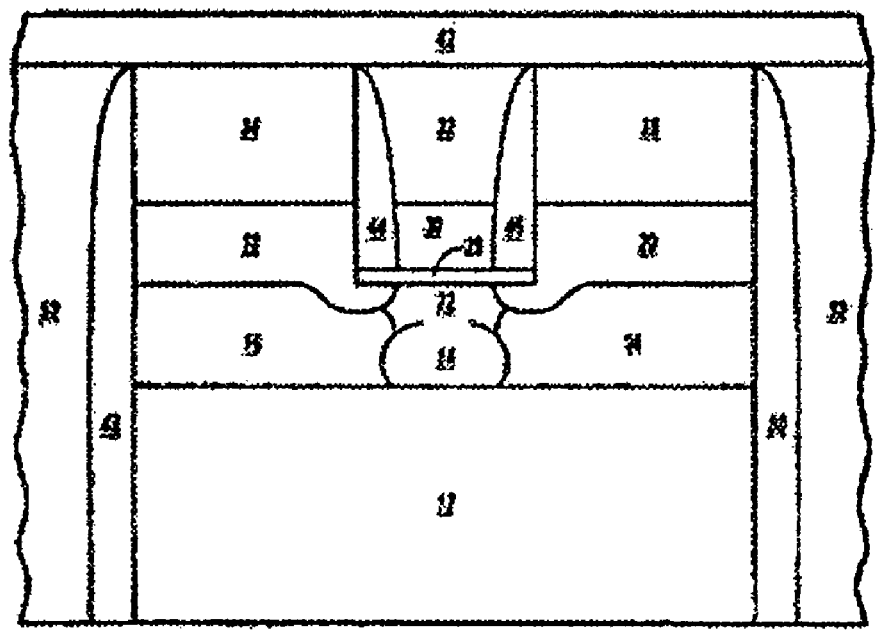
FIG. 19 is a cross-sectional view of the device of FIG. 18 after formation of a first local interconnect and an ILD layer.

Referring to FIG. 18, a top gate layer is deposited within the trench 504 using any number of methods such as sputtering, evaporation, pulsed laser ablation, oxidation, chemical vapor deposition, electroplating, and other techniques commonly known in the art. The top gate layer is then etched to form the top gate 30 in accordance with a top gate mask. Configuration of the top gate mask and doping of the bottom gate may be altered to manufacture alternative devices such as those shown in FIGS. 4 and 5. The top gate 30 may also be subjected (similar to the source/drain layer 500) to a metallization step involving the application and removal of a silicide to enhance mobility performance.

A conductive layer (see FIG. 19) is formed within the trench 504 and planarized to form the first local interconnect 32. Although not illustrated in FIG. 19, the second local interconnect 60 is disposed adjacent the insulator 62 and in contact with the bottom gate 14 as shown in FIG. 3. Spacers 48, 50 are formed on the perimeter of the transistor 10 to isolate the transistor 10. Formation of the spacers 48, 50 may occur simultaneously with the formation of spacers 44, 46. An STI layer 52 is formed proximate to the spacers 48, 50 to further isolate the transistor 10. Formation of the STI layer 52 may occur at any time after formation of the spacers 48, 50. An ILD layer 42 is disposed on the pads 34, 36, local interconnect 32, and STI layer 52 and then planarized.

Figure 20:
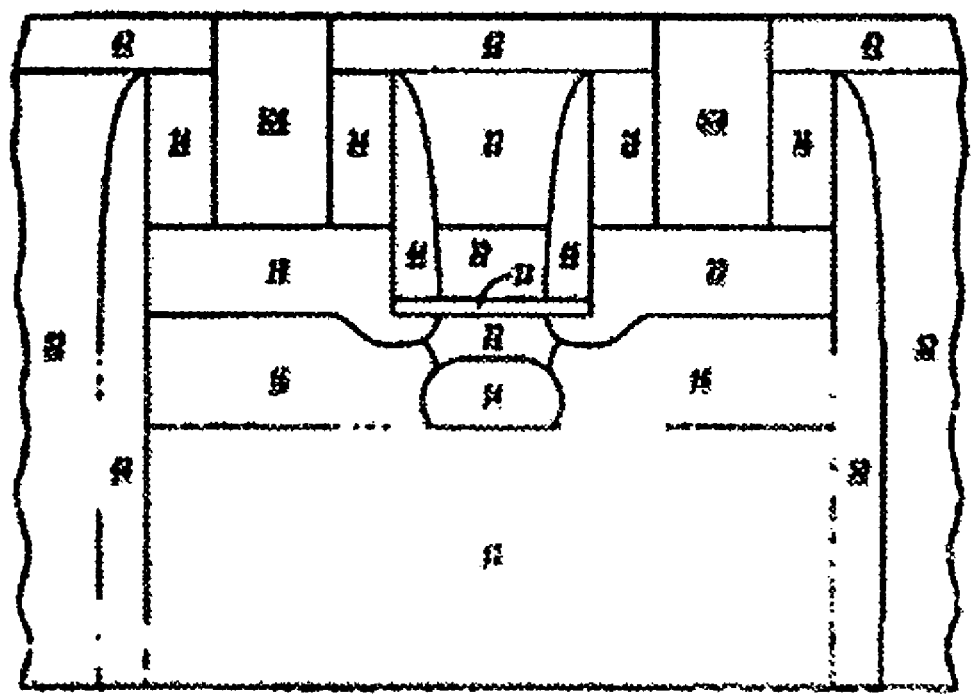
FIG. 20 is a cross-sectional view of the device of FIG. 19 after formation of contacts.

Referring to FIG. 20, a contact mask is applied to the ILD layer 42, and pads 34, 36 to form wells 508 that provide access to the source 18 and drain 20. A conductive layer is formed in the wells 508 and planarized to create contact layers 38, 40.

Similar techniques may be employed to manufacture the embodiments shown in FIGS. 9 to 11. Variations in deposition and etching techniques as well as selection of alternate materials may be employed in the manufacture of the presently invented transistor and are within the scope of the invention.

A further advantage of the present invention is its inherent radiation hardness. To limit radiation sensitivity, the pads 34, 36, exterior spacers 48, 50, 68, 70, and dielectric layer 16 may all be embodied as a nitride. The exterior spacer 48, 50, 68, 70 surround the transistor components. With the addition of the pads, 34, 36, the transistor 10 is encapsulated within nitride to provide a buffer against radiation. Radiation will tend to accumulate within an oxide such as in a buried oxide of the substrate 12. The source 18 and drain 20 are separated from the substrate 12 by the dielectric layer 16 to limit the effect of accumulated radiation. Remaining radiation effects may be compensated by dynamic control of the bottom gate 14.

The present invention provides a unique transistor architecture that greatly improves gate control of the channel. The improved gate control is achieved in various embodiments by providing extensions to distance the source and drain, spacers to insulate against the source and drain, and increased channel length. The resulting electron flow path has high mobility and high current drive. The transistor architecture is flexible and may be configured with different terminal connections for different electrical behavior. In one embodiment, the present invention provides a double-gated transistor with independent gate control.

As described above, the presently invented transistor may be fabricated to conform to any of the characteristics of an Independently-Double-Gated device, a Single-Gated transistor, or a Double-Gated MOSFET as represented by the schematics of FIGS. 6, 7, and 8, respectively. These configurations are accomplished by merely repositioning the masks for the top gate and the bottom gate relative to one another in the x-axis as has been shown in the representative embodiments of FIGS. 3, 4, and 5, respectively. The remainder of the discussion here will focus on the four terminal device represented schematically by FIG. 6, with a characteristic cross-section as shown in FIG. 3. This transistor provides control of the top gate 30 and the bottom gate 14 independent of one another and will be referred to as an Independent Double-Gated (IDG) FET. Though shown here as an N-channel device, it will be appreciated by one of skill in the art that an equivalent transistor may as well be embodied as a P-channel device.

Figure 21:
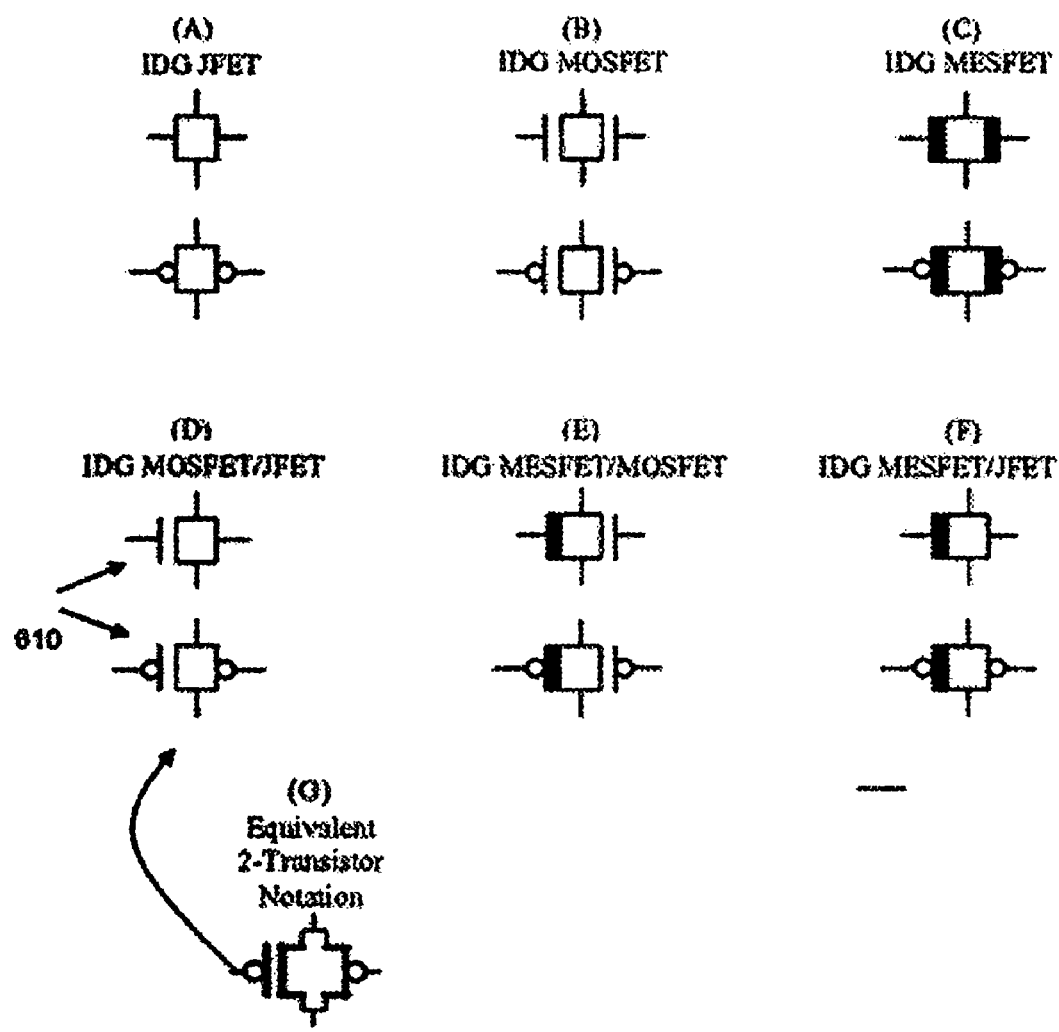
FIG. 21 shows schematic notations for a family of devices having various IDG transistor configurations that can be used to implement the combinational logic cells of the present invention.

In addition to the flexibility described above, each of the top and bottom gates may be fabricated independently of the other to behave in any of the JFET, MOSFET or MESFET modes. These modal combinations are shown in the family of devices of FIGS. 21A-21F. The MOSFET/JFET 610 combination of FIG. 21D will be used in the preferred embodiment of the present invention as either N-channel or P-channel devices where needed, reserving the other configurations for alternate embodiments. The equivalent 2-transistor notation of FIG. 21G depicts a standard PMOS FET in parallel with a standard P-channel JFET through connection of their sources and drains. The abbreviated notation of FIG. 21D is used to signify the functional equivalent of FIG. 21G as it has been consolidated into a single Independent Double-Gated IDG FET, as one configuration of the devices manufactured by American Semiconductor Inc. under the trade name Flexfet™.

Figure 22:
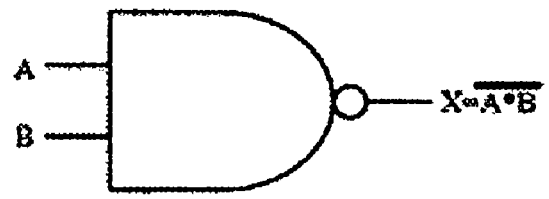
FIG. 22A is a truth table for the logical NAND function.
FIG. 22B shows the symbolic notation for the logical NAND function.
FIG. 22C is a transistor circuit diagram for a dynamic version of the logical NAND function.
FIG. 22D is a transistor circuit diagram for a static CMOS version of the logical NAND function.
Figure 22:
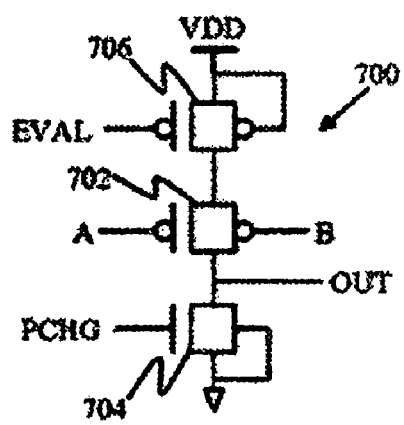
Figure 22:
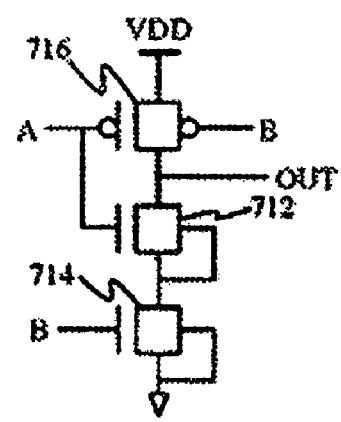

Reference is now made to FIG. 22, which describes in various forms embodiments of a NAND gate. FIG. 22A shows the truth table of a NAND gate which indicates that the output of such a gate will be at a '1' state for all conditions other than when both inputs A and B are at a '1' state, for which condition the output goes to '0'. FIG. 22B is the symbolic notation for the function described in the truth table of FIG. 22A. Depending upon requirements such as speed, layout size, and power consumption, the logical NAND function may be implemented as either a dynamic or a static circuit.

FIG. 22C shows the preferred embodiment of an implementation of the NAND circuit 700 using the IDG FET transistor described above and depicted in FIG. 21D. Implemented here in its dynamic form, the NAND function of two inputs A and B is accomplished by connection of those inputs to the top and bottom gates of a single IDG PMOS FET 702 with the output of the combinational function appearing at the drain of transistor 702. The savings here in terms of integrated circuit layout space is one transistor of the two that would have been required by the parallel combination of any type of transistor other than a double-gated FET having independently controllable gates. Using the techniques of the present invention allows a 50% reduction in transistor count for any function, or subfunction, which would normally be accomplished by parallel transistors.

In a simpler form of the NAND circuit 700, the load, represented here by transistor 704, could be replaced by a pulldown resistor and the optional transistor 706 could be replaced by a short to the power supply voltage Vdd. For considerations related to layout space, speed and power, the preferred embodiment uses an NMOS precharge transistor 704 with its bottom gate (shown here as the JFET) tied to ground. During the precharge phase when the PCHG signal is high (at logic '1'), the output will be pulled down towards ground, that is, precharged to a low (logic '0') condition. After the output has been precharged, the PCHG signal will be returned to a low logic state, allowing the output to float.

As long as either of the inputs A or B is low, transistor 702 will be in an on-state, attempting to pull the output high against the level established by the precharge transistor 704. Only when both of the inputs A and B are high will transistor 702 be turned off, in accord with the truth table of FIG. 22A, allowing the load provided by the precharge transistor 704 to pull the output low.

An optional PMOS transistor 706 is used for "evaluation" of this NAND function. To conserve power, the EVAL' signal is held high to keep transistor 706 in an Off state until such time as the output of the NAND circuit 700 is to be read, or sensed. By momentarily dropping the EVAL' signal low, the output, which had been precharged to a low condition, will dynamically reflect the appropriate NAND function based upon the instant state of inputs A and B. This capability is one of those used to control signal propagation when cascading multiple logic elements in order to prevent timing race conditions.

In dynamic logic circuits such as that seen in FIG. 22C, much attention is paid to the minimization of power consumption. The stack of transistors is clocked by means of PCHG and EVAL' to eliminate, or at least to reduce, the amount of time that transistors 704 and 706 are both in their On states. Designers of static CMOS circuitry take a different approach, wherein the pull-up and pull-down halves of the circuit are fully complementary so that one and only one half of a functional block is ever active at a given instant.

The preferred embodiment of a static complementary NAND gate is shown in FIG. 22D. Like its dynamic counterpart discussed above with regard to FIG. 22C, the basic two-input NAND function is accomplished by a single IDG PMOS FET 716, which takes the place of the two transistors that would be required for the parallel connection of two single gate transistors. Again, a 50% reduction in device count and integrated circuit layout space is achieved. Because the static configuration requires a pull-down that is fully complementary, two additional NMOS transistors 712 and 714 must be connected in series to ground. These pull-down transistors, 712 and 714, have their bottom gates tied to the Off state with their top gates tied to the logic inputs A and B.

Figure 23:
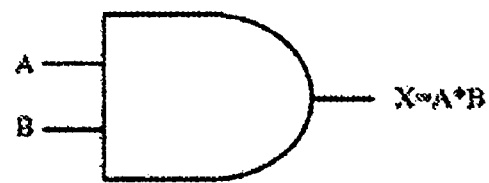
FIGS. 23A-23D show various representations of the logical AND function.
Figure 23:
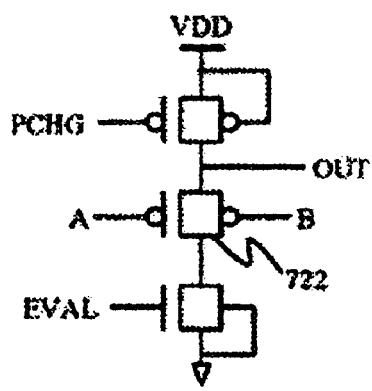
Figure 23:
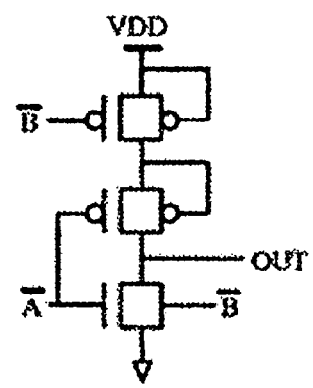

Refer now to FIG. 23 where an AND gate is described in terms of (A) a Truth Table, (B) Symbolic Notation, and schematics for (C) Dynamic and (D) Static circuit implementations. Since the NAND function is merely the inverse of a logical AND, it is no surprise that the circuit for the Dynamic AND-gate shown in FIG. 23C has a topology identical to the Dynamic NAND-gate of FIG. 22C. The difference between these two logic elements is that the functions of the Precharge and Evaluate transistors has been interchanged, and the output is taken from the source, rather than the drain, of the PMOS transistor 722.

Figure 24:
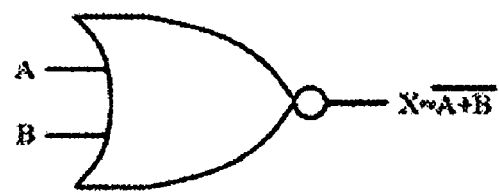
FIGS. 24A-24D show various representations of the logical NOR function.
Figure 24:
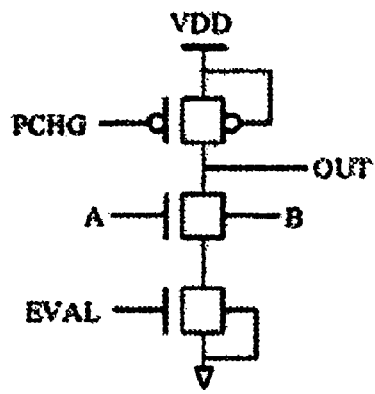
Figure 24:
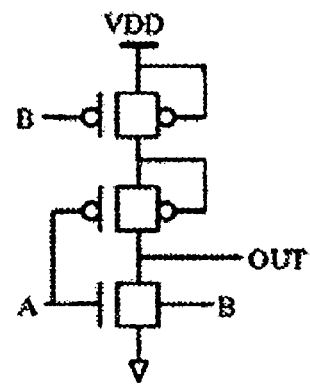
Figure 25:
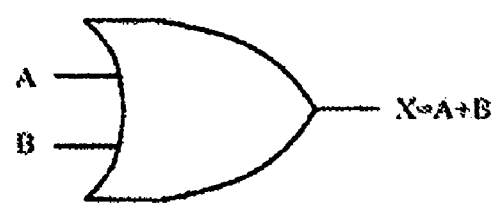
FIGS. 25A-25D show various representations of the logical OR function.
Figure 25:
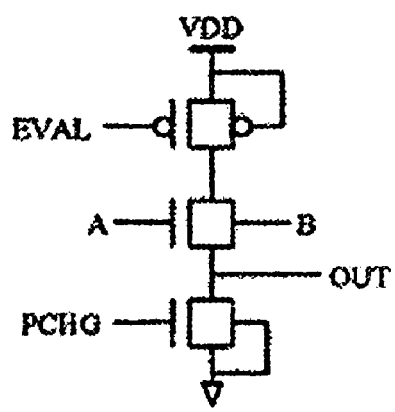
Figure 25:
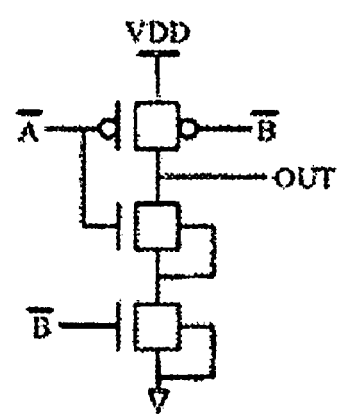

Recalling DeMorgan's Theorem as discussed previously, it is recognized that NOR(A, B)=AND(INV(A), INV(B)). This is useful for generation of the circuits for the dynamic and static versions of the NOR gates depicted in FIGS. 24C-24D, respectively, from the AND gates of FIGS. 23C-23D. Similarly, by invoking DeMorgan's Theorem again, the OR gates of FIGS. 25C-25D are derived from FIGS. 22C-22D.

Figure 26:
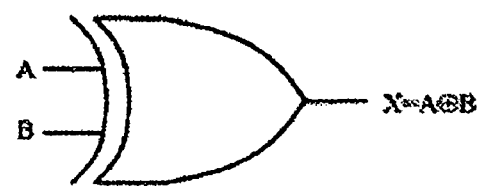
FIGS. 26A-26D show various representations of the logical XOR function.
Figure 26:
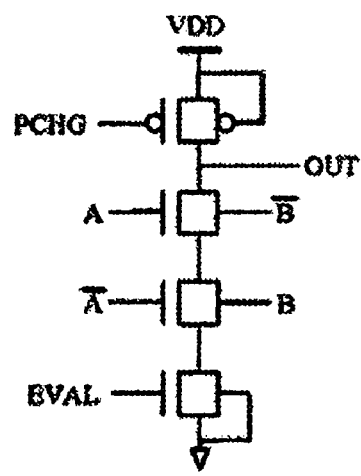
Figure 26:
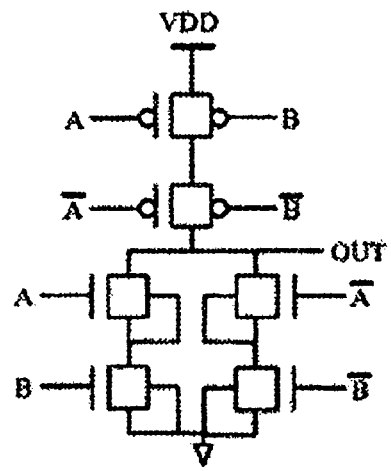

As mentioned above, the two-input XOR-gate is defined to assume an output state of 1 if only one of its inputs is 1, and the other is a 0, that is, XOR(A,B)=A'B+AB'. Applying DeMorgan's Theorem again yields XOR(A,B)=NAND((A+B'), (A'+B)). The resulting schematic for a dynamic XOR circuit with precharge and evaluation transistors is shown in FIG. 26C.

The static version of an XOR gate is shown in FIG. 26D. The complexity of this circuit relative to others within the family of two-input logic devices is due to the cross-coupling of the inverted inputs, but the methodology for designing the static XOR gate is no different than for any other complementary device.

Figure 27:
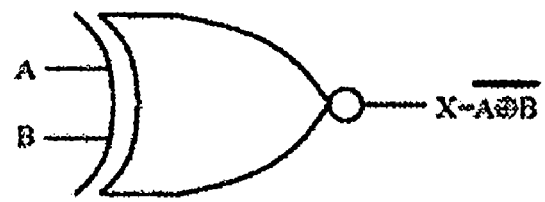
FIGS. 27A-27D show various representations of the logical XNOR function.
Figure 27:
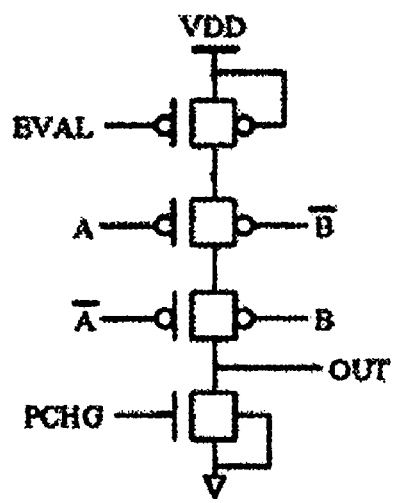
Figure 27:
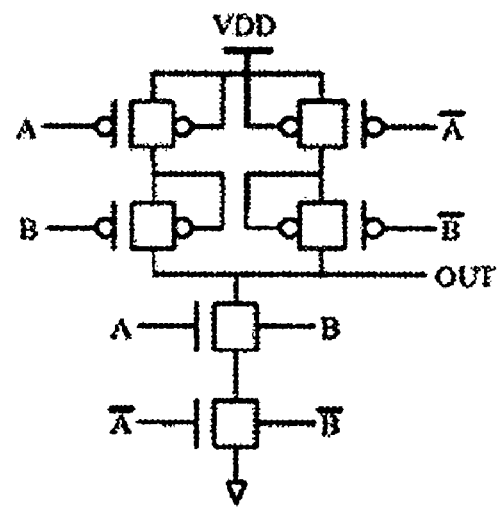

Since the output of an XNOR is intended to be the inversion of its XOR counterpart, the circuitry for an XNOR gate is generated by using methods similar to that for design of the XOR gate above. Dynamic and static versions of the XNOR gate are depicted in FIGS. 27C-D.

Alternative embodiments for Double-Gated field effect transistors may also be used for each of the transistors shown in FIGS. 22-27 with the necessary limitation that each device shown as having two external inputs must provide independent control of the double-gates. Additionally, any of the family of devices depicted here in FIGS. 21A-21F may be used for any of the transistors in any of the described logic elements.

The techniques described above are also useful for designing logic elements having more than two inputs. However, those skilled in the art will recognize that there are two problems associated with the expansion of these logic elements to accommodate more than two inputs, namely, series resistance and body effect. The design of the presently invented Independently-Double-Gated transistors is such that both of these effects are minimized. In fact, the Flexfet™ is fully depleted and therefore is not susceptible to body effect since its threshold voltage is not a function of its source voltage. The transistors of the present invention can easily be connected in series for the construction of a four-input AND gate. The use of longer strings of these transistors for the construction of gates having higher order inputs is limited by series resistance which is also improved over previous transistor designs.

Up to this point in the present discussion the primary focus has been on the reduction of transistor count. This reduction is an advancement over the prior art in that an integrated circuit can be made smaller, which increases efficiency and enhances the fabrication yield. Consider now the additional advantage provided by the IDG FETs that have been used in the preferred embodiment described above.

The use of IDG FETs is also highly desirable for ultra-low-power (ULP) circuit designs due to the fact that the independent double gates offer dynamic threshold control of digital logic circuits. By varying the bottom gate voltage of an IDG MOSFET, the standby leakage and power dissipation can be dynamically changed over several orders of magnitude, while the switching speed and operating frequency can be traded off directly against the active power dissipation. Therefore, minimum sized transistors can be used to achieve ULP when biased into a standby condition, and then re-biased to a high-performance active mode. This advantage holds for both static and dynamic CMOS logic gate families.

Figure 28:
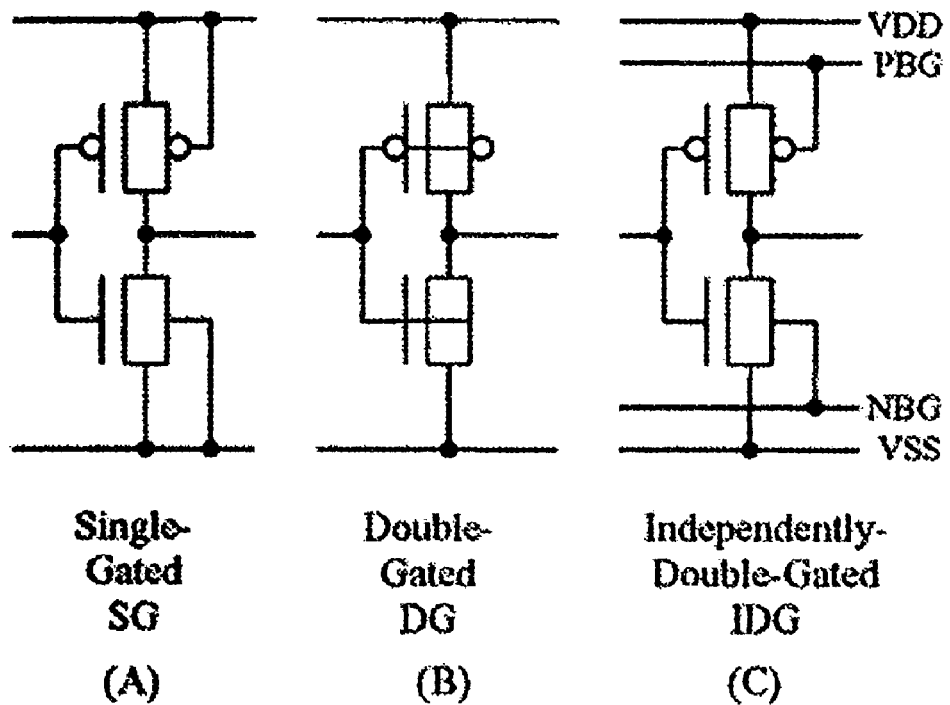
FIGS. 28A-28C shows various configurations of CMOS inverters, respectively, (A) Single Gate (SG), (B) Double-Gate (DG), and (C) Independently-Double-Gated (IDG)
Figure 29:
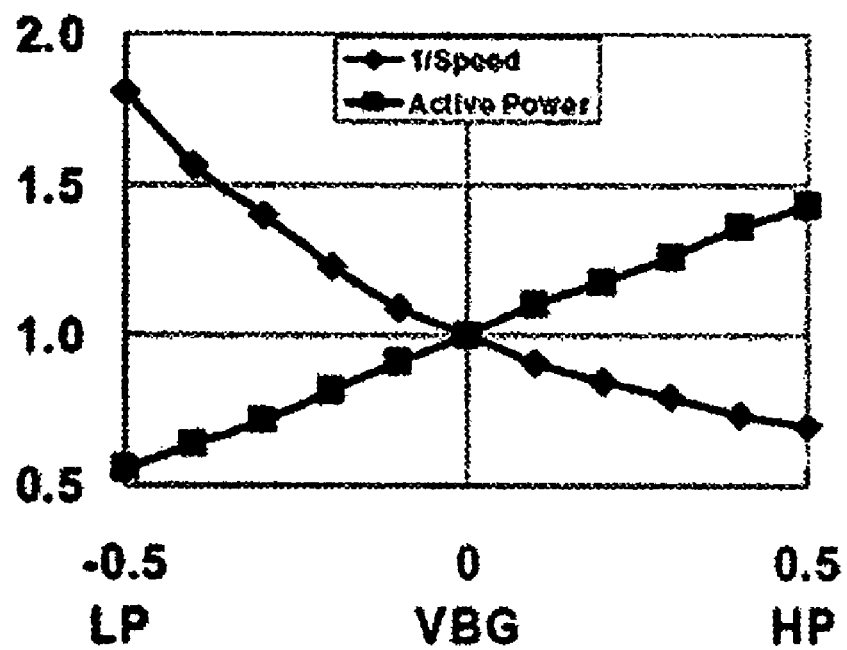
FIG. 29 is a graphical plot of data samples showing the active power versus switching delay as a function of the voltage applied to the Bottom Gate of each transistor in the IDG CMOS inverter of FIG. 28C.

As has been discussed above, the design of the Flexfet™ transistors provides for a MOSFET Top Gate self-aligned to a JFET Bottom Gate, transistor 610 in FIG. 21D. These independent top and bottom gates are contacted at opposite sides of the channel, which results in compact, planar connections to all four transistor terminals. Individual transistors can be connected as Single Gate (SG, FIG. 7), Double Gate (DG, FIG. 8), or Independently Double-Gated (IDG, FIG. 6) as shown in the CMOS inverters of FIGS. 28A-28C, respectively. A high degree of dynamic threshold control means that only a small voltage range, amounting to about one volt (VBG=−0.5V to +0.5V), on the Bottom Gate is required to switch between low power (LP) and high performance (HP) modes of operation. FIG. 29 shows the tradeoff that is possible between active power versus delay (the inverse of speed) simply by adjusting the Bottom Gate voltage of each transistor.

While it is possible to provide one independent Bottom Gate control line for each individual transistor, it may be more desirable to group several transistors together with one shared Bottom Gate, similar to what is often done in a bulk CMOS well. For example, the Bottom Gates of all PMOS transistors in a circuit can be tied together to a signal named PBG, while the Bottom Gates of all of the NMOS transistors are tied together to a signal called NBG. This is superior to bulk CMOS because neither NBG nor PBG are connected to the substrate and thus to ground.

Figure 30:
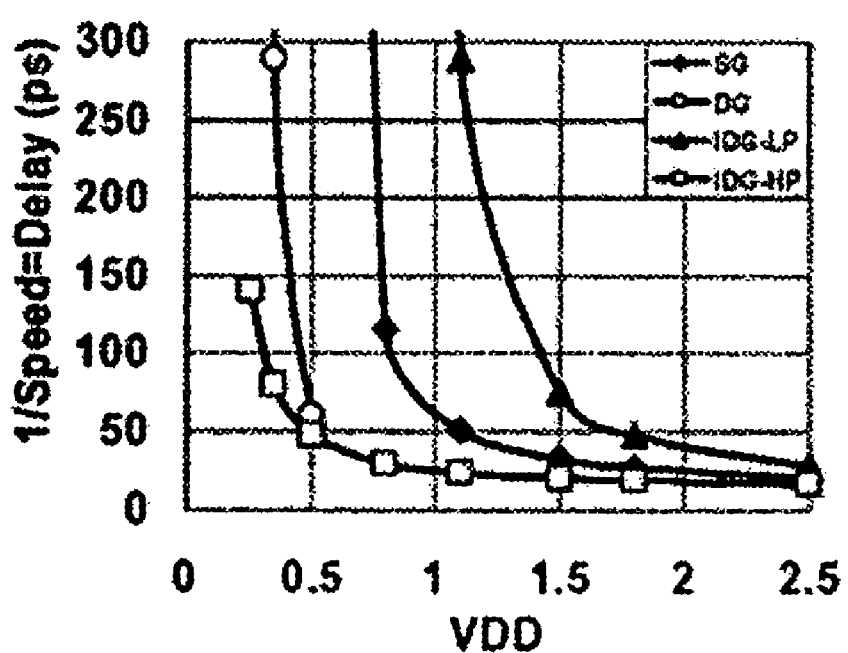
FIG. 30 shows the inverter gate delay of SG, DG, low power IDG, and high performance IDG, as a function of power supply voltage VDD for a 180 nm IDG CMOS technology.

FIG. 30 shows the gate delays of inverters constructed and operated as SG, DG, low power IDG, and high performance IDG, as a function of power supply voltage VDD for a 180 nm IDG CMOS technology. The slowest, lowest power, condition occurs when both NBG & PBG Bottom Gates are biased into their Off state at −0.5V, while the fastest, highest power, condition occurs when both Bottom Gates are held On at +0.5V. As can be seen in FIG. 30, the SG inverter gate fails below VDD=1.5V. The DG inverter gate fails below 0.5V. The IDG inverter gate works well over a wide VDD range, with the high performance condition (VBG=+0.5V) working down to VDD=0.25V. Essentially all static and dynamic digital circuits, as well as analog/MS/RF circuits can benefit from IDG operation.

The present invention provides an architecture for a family of logic elements that realizes the combination of two parallel transistors in a single Independently-Double-Gated transistor. The single transistor logic gates described here require less layout size than has been used in the prior art. The single transistor gates shown here may be used in numerous complex circuits to significantly reduce overall size. Use of a single transistor further provides lower power dissipation, higher speed, and reduces instances of parasitic capacitance. As a flexible FET, the Flexfet™ transistor provides improved gate control and inherent radiation resistance.

It will be obvious to those having skill in the art that many changes may be made to the details of the above-described embodiments without departing from the underlying principles of the invention. The scope of the present invention should, therefore, be determined only by the following claims.

What is claimed is:

1. A two-input logic gate circuit, comprising:
   a first input;
   a second input;
   an Independently-Double-Gated (IDG) field effect transistor (FET) including,
      a substrate,
      a bottom gate disposed on the substrate and coupled to the second input,
      a source,
      a drain,
      a channel disposed on the bottom gate and coupled to and disposed between the source and the drain, the channel providing a junction contact to the bottom gate to form a Junction FET (JFET);
      a gate insulator disposed on the channel,
      a top gate disposed on the gate insulator to form a MOS FET, wherein the top gate is coupled to the first input; and
   an output.

2. The two-input logic gate circuit of claim 1, wherein the MOS FET formed at the top gate of the Independently-Double-Gated field effect transistor is a first IDG PMOS transistor, and
   said output is coupled to the drain of the first IDG PMOS transistor,
   whereby said output indicates the logical NAND of the first input and the second input.

3. The two-input logic gate circuit of claim 2, further comprising a precharge transistor coupled to the drain of the first IDG PMOS transistor to effect a low voltage on the drain, wherein the precharge transistor is an NMOS transistor.

4. The two-input logic gate circuit of claim 2, further comprising an evaluation transistor coupled to the source of the first IDG PMOS transistor to effect a high voltage on the source, wherein the evaluation transistor is a second instance of a PMOS transistor.

5. The two-input logic gate circuit of claim 2, further comprising:
   a first NMOS transistor coupled at its drain to the drain of the first IDG PMOS transistor, and
   a second NMOS transistor coupled at its drain to the source of the first NMOS transistor,
   wherein the first input is further coupled to the top gate of one of the NMOS transistors, and wherein the second input is further coupled to the top gate of the other of the NMOS transistors.

6. The two-input logic gate circuit of claim 1, wherein the MOS FET formed at the top gate of the Independently-Double-Gated field effect transistor is a first IDG PMOS transistor, and
said output is coupled to the source of the first IDG PMOS transistor,
whereby said output indicates the logical AND of the first input and the second input.

7. The two-input logic gate circuit of claim 1, wherein the MOS FET formed at the top gate of the Independently-Double-Gated field effect transistor is a first IDG NMOS transistor, and
said output is coupled to the drain of the first IDG NMOS transistor,
whereby said output indicates the logical NOR of the first input and the second input.

8. The two-input logic gate circuit of claim 7, further comprising a precharge transistor coupled to the drain of the first IDG NMOS transistor to effect a high voltage on the drain, wherein the precharge transistor is a PMOS transistor.

9. The two-input logic gate circuit of claim 7, further comprising an evaluation transistor coupled to the source of the first IDG PMOS transistor to effect a low voltage on the drain, wherein the evaluation transistor is a second instance of an NMOS transistor.

10. The two-input logic gate circuit of claim 7, further comprising:
a first PMOS transistor coupled at its drain to the drain of the first IDG NMOS transistor, and
a second PMOS transistor coupled at its drain to the source of the first PMOS transistor,
wherein the first input is further coupled to the top gate of one of the PMOS transistors, and
wherein the second input is further coupled to the top gate of the other of the PMOS transistors.

11. The two-input logic gate circuit of claim 1, wherein the MOS FET formed at the top gate of the Independently-Double-Gated field effect transistor is a first IDG NMOS transistor, and
said output is coupled to the source of the first IDG NMOS transistor,
whereby said output indicates the logical OR of the first input and the second input.

12. The two-input logic gate circuit of claim 1, wherein the MOS FET formed at the top gate of the Independently-Double-Gated field effect transistor is a first IDG NMOS transistor, further comprising:
a second IDG NMOS transistor, wherein the drain of the second NMOS transistor is coupled to the source of the first NMOS transistor;
an inversion of the first input is coupled to a top gate of the second NMOS transistor;
an inversion of the second input is coupled to a bottom gate of the second NMOS transistor; and
said output is coupled to the drain of the first NMOS transistor,
whereby said output indicates the logical XOR of the first input and the second input.

13. The two-input logic gate circuit of claim 1, wherein the Independently-Double-Gated field effect transistor is a first PMOS transistor, further comprising:
a second IDG PMOS transistor, wherein the drain of the second PMOS transistor is coupled to the source of the first PMOS transistor;
an inversion of the first input is coupled to a top gate of the second PMOS transistor;
an inversion of the second input is coupled to a bottom gate of the second PMOS transistor; and
said output is coupled to the drain of the first PMOS transistor,
whereby said output indicates the logical XNOR of the first input and the second input.

* * * * *